United States Patent
Haas et al.

(10) Patent No.: US 7,397,181 B2
(45) Date of Patent: Jul. 8, 2008

(54) IMAGE DISPLAY PANEL CONSISTING OF A MATRIX OF MEMORY-EFFECT ELECTROLUMINESCENT CELLS

(75) Inventors: Gunther Haas, Saint Grégoire (FR); Jean-Paul Dagois, Cesson Sévigné (FR)

(73) Assignee: Thomson Licensing, Boulogne Billancourt (FR)

( * ) Notice: Subject to any disclaimer, the term of this patent is extended or adjusted under 35 U.S.C. 154(b) by 44 days.

(21) Appl. No.: 10/484,794

(22) PCT Filed: Jul. 17, 2002

(86) PCT No.: PCT/FR02/02548

§ 371 (c)(1),
(2), (4) Date: Jan. 23, 2004

(87) PCT Pub. No.: WO03/012869

PCT Pub. Date: Feb. 13, 2003

(65) Prior Publication Data

US 2004/0233138 A1 Nov. 25, 2004

(30) Foreign Application Priority Data

Jul. 27, 2001 (FR) .................................. 01 10289

(51) Int. Cl.
*H05B 33/22* (2006.01)

(52) U.S. Cl. ....................................... 313/507; 313/504

(58) Field of Classification Search ......... 313/498–512; 345/76, 77, 36, 45; 315/169.3
See application file for complete search history.

(56) References Cited

U.S. PATENT DOCUMENTS

| 2,792,447 | A | * | 5/1957 | Kazan ......................... 348/803 |
| 2,874,308 | A | * | 2/1959 | Livingston ............ 250/214 LA |
| 2,897,399 | A | * | 7/1959 | Garwin et al. ................. 315/10 |
| 2,904,697 | A | * | 9/1959 | Halsted ....................... 330/308 |
| 2,948,823 | A | * | 8/1960 | Wasserman ................. 313/507 |
| 3,070,701 | A | * | 12/1962 | Wasserman ............... 250/208.3 |
| 3,084,262 | A | * | 4/1963 | Tomlinson ............ 250/214 LA |
| 3,375,373 | A | * | 3/1968 | Hageman .................... 365/215 |
| 3,502,885 | A | * | 3/1970 | Stewart ................ 250/214 LA |
| 4,538,884 | A | * | 9/1985 | Masaki ........................ 349/28 |
| 5,053,679 | A | | 10/1991 | Thioulouse .............. 315/169.3 |
| 5,055,739 | A | | 10/1991 | Thioulouse ................. 313/507 |
| 5,432,015 | A | * | 7/1995 | Wu et al. ..................... 428/690 |
| 5,759,444 | A | * | 6/1998 | Enokida et al. ........ 252/301.16 |
| 6,188,175 | B1 | | 2/2001 | May et al. ................... 313/504 |
| 6,366,025 | B1 | * | 4/2002 | Yamada ................... 315/169.3 |

* cited by examiner

*Primary Examiner*—Ashok Patel
*Assistant Examiner*—Christopher Raabe
(74) *Attorney, Agent, or Firm*—Joseph J. Laks; Harvey D. Fried; Patricia Verlangieri

(57) ABSTRACT

The invention concerns a panel comprising an electroluminescent organic layer and a photoconductive layer, having sandwiched between said two layers, an intermediate layer of electrodes electrically insulated from one another. The cells of said panel are provided with memory effect which makes them particularly simple to operate; preferably, during the addressing phases, compensation operations are used. By using the openings in an intermediate opaque layer or by using semi-transparent intermediate electrodes, it is possible to adapt simply and economically, at each cell, optical coupling between the electroluminescent layer and the photoconductive layer.

9 Claims, 10 Drawing Sheets

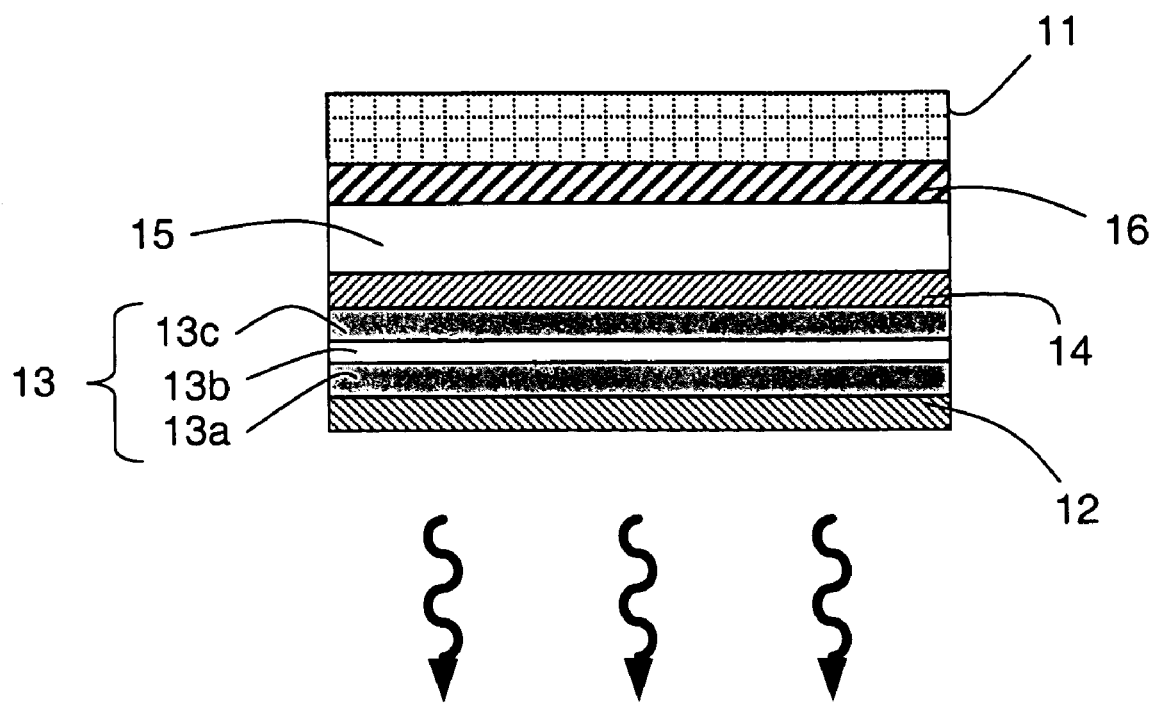
FIG. 1 – PRIOR ART
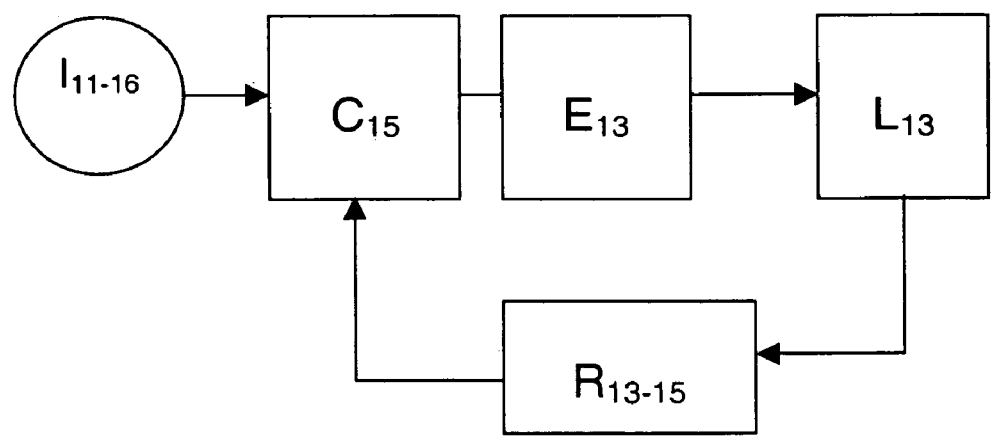
FIG. 2

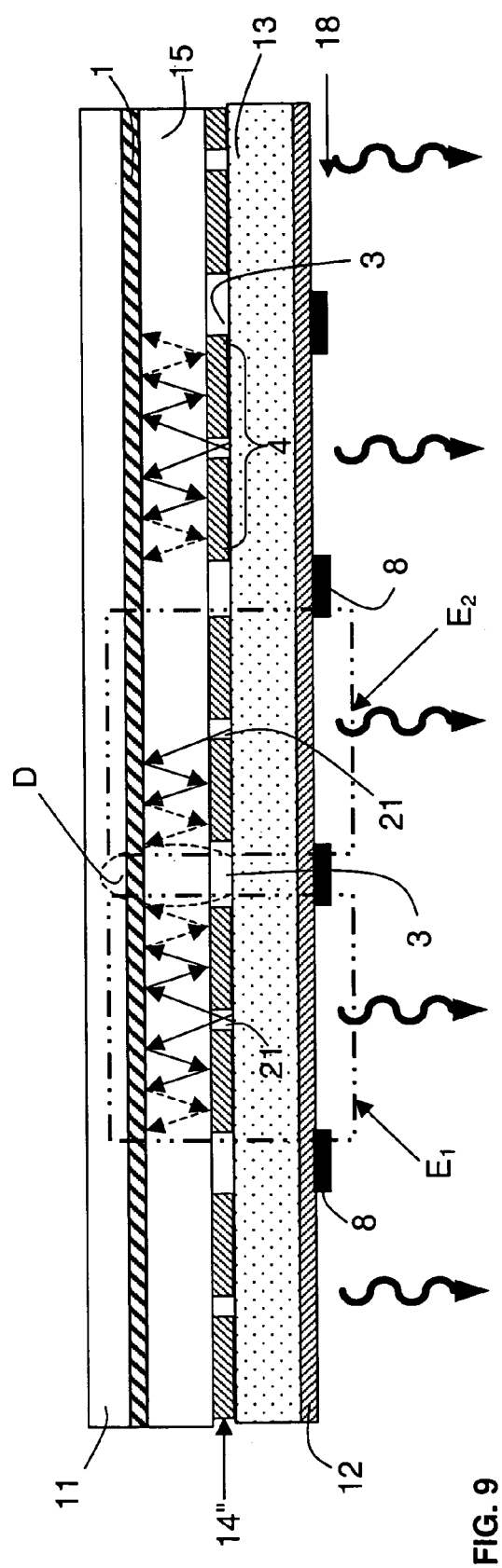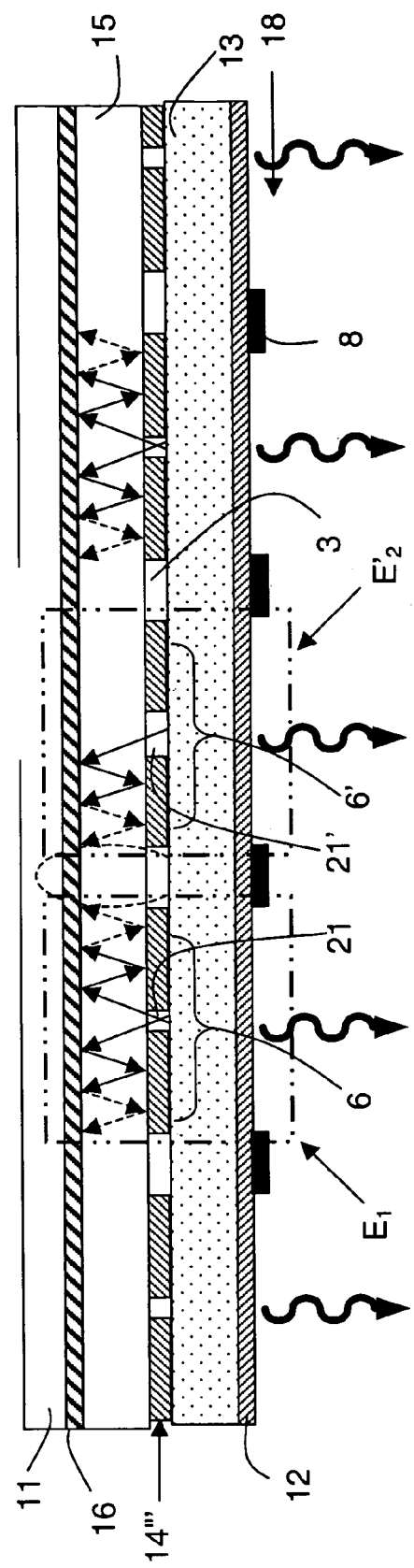

IMAGE DISPLAY PANEL CONSISTING OF A MATRIX OF MEMORY-EFFECT ELECTROLUMINESCENT CELLS

This application claims the benefit, under 35 U.S.C. § 365 of International Application PCT/FR02/02548, filed Jul. 17, 2002, which was published in accordance with PCT Article 21(2) on Feb. 13, 2003 in French and which claims the benefit of French patent application No. 0110289, filed Jul. 27, 2001.

The invention relates to an image display panel formed from a matrix of electroluminescent cells having a memory effect, comprising, with reference to FIG. 1:
- an electroluminescent organic layer 13 capable of emitting light towards the front of the said panel (light emission arrows in the figure);
- to the front of this layer, a transparent front layer 12 of electrodes;
- to the rear of this layer, a photoconducting layer 15, the said photoconducting layer itself being inserted between an opaque rear layer 16 of electrodes and an intermediate layer 14 of electrodes in contact with the electroluminescent layer.

The photoconducting layer 15 is intended to provide the cells of the panel with a memory effect which will be described later.

The panels of this type also include a substrate 11, to the rear or to the front of the panel, for supporting all of the layers described above; it is in general a sheet of glass or of polymeric material.

The electrodes of this panel must be suitable for being able to actuate and sustain the emission from the cells of the panel, independently of one another; for this purpose, each electrode of the front layer 12 serves a row Y of cells and each electrode of the rear layer serves a column X of cells; the electrodes may also have the reverse configuration, namely front layer electrodes in columns and rear layer electrodes in rows; the cells of the panel are therefore located at the intersections of the row electrodes Y and column electrodes X, and are thus arranged in a matrix.

The subject of the invention is an advantageous arrangement of the electrodes of the intermediate layer.

To display on such a panel images partitioned into a matrix of luminous dots, the electrodes of the various layers are supplied so as to make an electrical current flow through the cells of the panel corresponding to the luminous dots of the said image; the electrical current which flows between an electrode X and an electrode Y for supplying a cell positioned at the intersection of these electrodes passes through the electroluminescent layer 13 located at this intersection; the cell thus excited by this current then emits light towards the front face of the panel; the emission from all of the excited cells of the panel forms the image to be displayed.

Documents U.S. Pat. No. 4,035,774 (IBM), U.S. Pat. No. 4,808,880 (CENT) and U.S. Pat. No. 6,188,175 B1 (CDT) disclose a panel of this type.

The electroluminescent organic layer 13 is divided in general into three sublayers, namely an electroluminescent central sublayer 13$b$ inserted between a hole-transporting sublayer 13$a$ and an electron-transporting sublayer 13$c$.

The electrodes of the front layer 12 of electrodes, in contact with the hole-transporting sublayer 13$a$, then serve as anodes; this layer 12 of electrodes must be at least partly transparent in order to let the light emitted by the electroluminescent layer 13 pass through it towards the front of the panel; the electrodes of this layer are themselves generally transparent and made of a mixed indium tin oxide (ITO) or a conducting polymer such as polyethylene dioxythiophene (PDOT).

The electrodes of the intermediate layer 14 of electrodes, in contact with the electron-transporting sublayer 13$c$, then serve as cathodes; this layer must be sufficiently transparent to ensure optical coupling between the electroluminescent central sublayer 13$b$ and the photoconducting layer 15; as described below, this optical coupling is necessary for the operation of the panel; document U.S. Pat. No. 6,188,175 teaches that this layer may be made of a transparent conducting material and that, if it is made of an opaque conducting material, then it must be provided and pierced with features suitable for letting the maximum amount of light pass through it (column 5, rows 60-64).

The documents cited above also disclose configurations in which the positions of the hole-injecting sublayer 13$a$ and of the electron-injecting sublayer 13$c$ are inverted with respect to the electroluminescent central sublayer 13$b$; the hole-injecting sublayer 13$a$ is then in contact with the electrodes of the intermediate layer 14, which become anodes, and the electron-injecting sublayer 13$c$ is then in contact with the electrodes of the front layer 12, which then serve as cathodes.

According to another variant, the front layer 12 of electrodes may itself comprise several sublayers, including a sublayer interfacial with the electroluminescent organic layer 13 intended to improve the injection of holes (in the anode case) or of electrons (in the cathode case).

The photoconducting layer 15 may, for example, be made of amorphous silicon or of cadmium sulphide.

In the display panels of this type, the role of the photoconducting layer 15 is to provide the cells of the panel with a "memory" effect; each cell of the panel encompasses a region of electroluminescent layer 13 and, opposite the latter, a region of photoconducting layer 15 which acts as a supply switch for the cell; as soon as a region of electroluminescent layer 13 is excited by applying a suitable potential to its terminals, the corresponding region of the photoconducting layer 15 receives light emitted by the electroluminescent layer 13 through the electrodes of the intermediate layer 14 and becomes conducting.

The various electrodes of the panel must be supplied and driven so that, as long as a region of the photoconducting layer 15 is conducting, an electrical current passes through the corresponding region of the electroluminescent layer 13 so that this region continues to emit light and the corresponding region of the photoconducting layer 15 remains conducting; thus, when the switch, which corresponds to a region of photoconducting layer 15, passes into the closed state, this switch remains in the closed state and the cell continues to be excited; this switch must therefore operate like a flip-flop so as to confer a "memory effect" on the cells of the panel.

This memory effect therefore corresponds to each cell of the panel operating in loop mode, as shown in FIG. 2: as long as an electroluminescent cell $E_{13}$ emits light $L_{13}$, which acts via coupling $R_{13-15}$ on the corresponding region $C_{15}$ of the photoconducting layer 15, the flip-flop switch formed by this region $C_{15}$ is closed and as long as this switch $C_{15}$ is closed, the electroluminescent cell $E_{13}$ emits light $L_{13}$.

The object of the invention is to provide a suitable structure for the various layers of electrodes, especially the intermediate layer of electrodes, and optionally a method of driving these electrodes, which are simple and economic to manufacture or to implement and which ensure that all the cells of the panel operate with a memory effect.

The operation of each cell of the panel in loop mode also relies on optical coupling $R_{13-15}$ between the electroluminescent layer 13 and the photoconducting layer 15; this coupling causes serious problems as it depends on the structure of the panel and on the electroluminescent and photoconducting materials: this is because the resistance of the photoconducting region of a cell depends on the nature of the photoconducting material, on the surface of this region and on its thickness within the photoconducting layer 13; in addition, the surface of this region capable of passing from the conducting state depends inter alia on the intensity of emission of the electroluminescent cell, on the sensitivity of the photoconducting material and on its level of absorption of the light emitted by the cell; the intensity of emission of the electroluminescent cell itself depends on the thickness of the electroluminescent layer and on the electroluminescent material.

Furthermore, in the colour image display panels, which comprise cells emitting various colours, the level of illumination required so that the photoconducting region of a cell passes into the conducting state will vary according to the emission colour of this cell, because the photoconducting material has in general a sensitivity which differs according to the colours; in this case, the optical coupling between the electroluminescent layer 13 and the photoconducting layer 15 also poses further problems.

The object of the invention is to provide a flexible and economic solution to the problems of optical coupling between the electroluminescent layer 13 and the photoconducting layer 15 of the display panels of the aforementioned type.

For the purpose of providing an easily drivable panel with a memory effect, the subject of the invention is an image display panel formed from a matrix of electroluminescent cells having a memory effect, which are capable of emitting light towards the front of the said panel, comprising:

an electroluminescent organic layer;
to the front of this layer, a transparent front layer of electrodes;
to the rear of this layer, a photoconducting layer for obtaining the said memory effect, the said photoconducting layer itself being inserted between an opaque rear layer of electrodes and an intermediate transparent or semitransparent layer of intermediate electrodes in contact with the electroluminescent layer, characterized in that each cell is provided with an intermediate electrode and in that the intermediate electrodes of the various cells are electrically isolated from one another.

All these layers are incorporated into the same panel and on one and the same substrate.

The front and rear layers of electrodes are generally discontinuous so as to form an array of conductors which can be driven separately.

Each cell of the panel therefore comprises, between an electrode of the front layer and an electrode of the rear layer, a region of the electroluminescent organic layer, an intermediate electrode and a region of the photoconducting layer.

Each cell of the panel is then supplied between an address and sustain electrode for the front or rear layer and an electrode referred to as the data electrode for the other, rear or front, layer.

Such a panel offers a memory effect which makes it possible to drive it in a very simple and economic manner; thus, preferably, this panel comprises supply and drive means suitable:

for applying, in succession to each address and sustain electrode, a signal referred to as the write initiation signal $V_a$ during an address phase and for applying, during the same time, a signal referred to as the sustain signal $V_s$, to the other address and sustain electrodes; and during application of a write signal $V_a$ to the said address and sustain electrode, for simultaneously applying to the data electrodes a data signal of value either $V_{off}$ or $V_{on}$ depending on whether it is desired not to activate or to activate, respectively, the cell located at the intersection of the data electrode in question with the said address and sustain electrode during the subsequent sustain phase of the cells supplied via the said address and sustain electrode.

If $V_T$ is the voltage at the terminals of a cell of the panel above which a cell in the non-activated state "OFF" switches to the activated state "ON", and if $V_D$ is the voltage for triggering the emission from that portion of the said electroluminescent layer which corresponds to a cell, preferably the supply and drive means are designed so that:

$$V_a - V_{on} \geq V_T \text{ and } V_a - V_{off} < V_T$$

$$V_s - V_{on} < V_T \text{ and } V_s - V_{off} > V_D.$$

This thus results in the desired memory effect which considerably simplifies the way in which the panel is actuated and driven.

According to a variant of the invention, the supply and drive means are suitable for simultaneously applying, during each phase of addressing an address and sustain electrode, a signal referred to as the compensation signal $V_C$ to the various data electrodes, where $V_C = V_{off}$ for the data electrodes receiving a data signal $V_{on}$ during the said address phase, where $V_C = V_{on}$ for the data electrodes receiving a data signal $V_{off}$ during the said address phase, the duration of application of the said compensation signal $V_C$ being approximately equal to the duration of application of the data signal $V_{on}$ or $V_{off}$.

The compensation signal is preferably applied immediately after the write initiation signal.

Thanks to this compensation signal, at each phase during which an address and sustain electrode is being addressed, the average of the signals sent to the data electrodes is always identical to whatever the number of cells to be activated or not activated which are supplied by the said address and sustain electrode, that is to say whatever the video content assigned to the said electrode; consequently, the other electrodes, which are not in the addressing but sustaining phase during this time, are not affected by the video content of the electrode being addressed. This advantageously provides very uniform distribution of the electrical energy delivered by the means for supplying and driving these electrodes during the sustain phase; thanks to this selective compensation operation associated with each write operation, the quality of the image displayed by the panel is considerably improved.

During each phase of addressing an address and substain electrode, before the write initiation signal, erase signals $V_{E-Y}$ and $V_{E-X}$ are generally applied to the address and sustain electrode and to the data electrodes, respectively; it is suitable for the condition $V_{E-Y} - V_{E-X} < V_D$ to be chosen so as to turn off all the cells which are supplied by the said address and sustain electrode; generally, to simplify the supply and drive means, the condition $V_{E-Y} = V_{E-X} = V_{on}$ is chosen.

For the purpose of providing a flexible and economic solution to the aforementioned optical coupling problems, the panel according to the invention comprises an opaque layer lying between the electroluminescent layer and the photoconducting layer which itself includes, within each cell of the panel, a group of at least one optical coupling aperture passing through this opaque layer; preferably, each group is positioned approximately at the centre of a cell; according to a variant, the opaque layer forms part of the intermediate layer of electrodes.

The term "opaque layer" is understood to mean a layer which does not let visible light pass through it; this layer may be absorbent (black) or reflective (metal).

Thus, if the opaque layer is made of an insulating material, it is via the holes in this layer that not only the light but also the electrical current will pass from the electroluminescent layer to the photoconducting layer through the intermediate electrodes which therefore have to be transparent or semi-transparent; with the exception of these holes, this opaque layer may be continuous since it is insulating and there is no risk of the intermediate electrodes with which it is in contact being short-circuited.

If the opaque layer is made of a conducting material, it becomes an integral part of the intermediate electrodes; it therefore can no longer be continuous since the intermediate electrodes are, according to the invention, electrically isolated from one another.

For the purpose of offering a flexible and economic solution to the aforementioned optical coupling problems, the intermediate layer of electrodes of the panel is semi-transparent and has an optical density adapted to the necessary optical coupling between the said electroluminescent layer and the said photoconducting layer in order to obtain the said memory effect.

The number and the area of the apertures in the opaque layer or the optical density of the semi-transparent intermediate layer are simple and economic means for adapting, within each cell, the optical coupling between the electroluminescent layer and the photoconducting layer, and thus for optimizing the operation of the panel, since this optical coupling may be advantageously adjusted and adapted according to the panels and according to the cells of the same panel by choosing the number of apertures per group and the area of these apertures; in short, these apertures advantageously allow the excitation of the photoconducting layer to be locally adapted.

Each group of apertures of a cell or each semi-transparent intermediate electrode acts as a means of adapting the level of illumination of the photoconducting region to the required level so that this region switches into the conducting state.

When the panel comprises at least two groups of electroluminescent cells capable of emitting light of different colour, it is preferable, depending on the way in which the optical coupling is adapted according to the invention:

either for the density of apertures and/or the sum of the areas of the apertures of a group of apertures to differ according to the groups of cells of different colour;

or for the optical density of the said intermediate layer to differ according to the groups of cells of different colour.

Thanks to the invention, by adapting to the emission colour of a cell, the overall aperture of this cell, that is to say the sum of the areas of the optical coupling apertures of this cell and/or the density of these apertures, it is easy to obtain the identical conductivity in the excited state for all the photoconducting layer regions facing all the cells of the panel, whatever their emission colour, and thus improve the operation of the panel.

Preferably, facing each aperture of each group of optical coupling apertures, the panel comprises an opaque masking element positioned to the front of the electroluminescent layer.

Thanks to these opaque elements, each optical coupling aperture in the intermediate opaque layer is masked from the external ambient illumination of the panel and any risk of ambient light entering the photoconducting layer is limited; any risk of the panel malfunctioning in strong ambient light is therefore limited; this is because the optical coupling apertures for each cell, which are intended for transferring light to the photoconducting layer provided that this light comes from the electroluminescent layer, are thus masked from a light source external to the panel.

Preferably, both photoconducting layer interfaces are reflective, except preferably in the inter-cell regions which correspond to the regions located between the intermediate electrodes.

These reflective interfaces therefore act as a lightguide for the light coming from the photoconducting layer through the apertures according to the invention; this light can then propagate so as to illuminate and excite a larger area of photoconducting layer than in the prior art, thereby advantageously reducing the electrical resistance of this layer in the excited state and limiting the electrical losses; this lightguide effect is particularly advantageous in the case of a photoconducting, especially an organic photoconducting, material having an index similar to that of the electroluminescent organic material, being used.

The invention will be more clearly understood on reading the description which follows, given by way of non-limiting example and with reference to the figures:

FIG. 1, already described, is a schematic sectional view of a cell of an electroluminescent display panel having a memory, provided with a photoconducting layer according to the prior art;

FIG. 2 describes the operation in loop mode of the cells of this type of panel;

Figure 7:
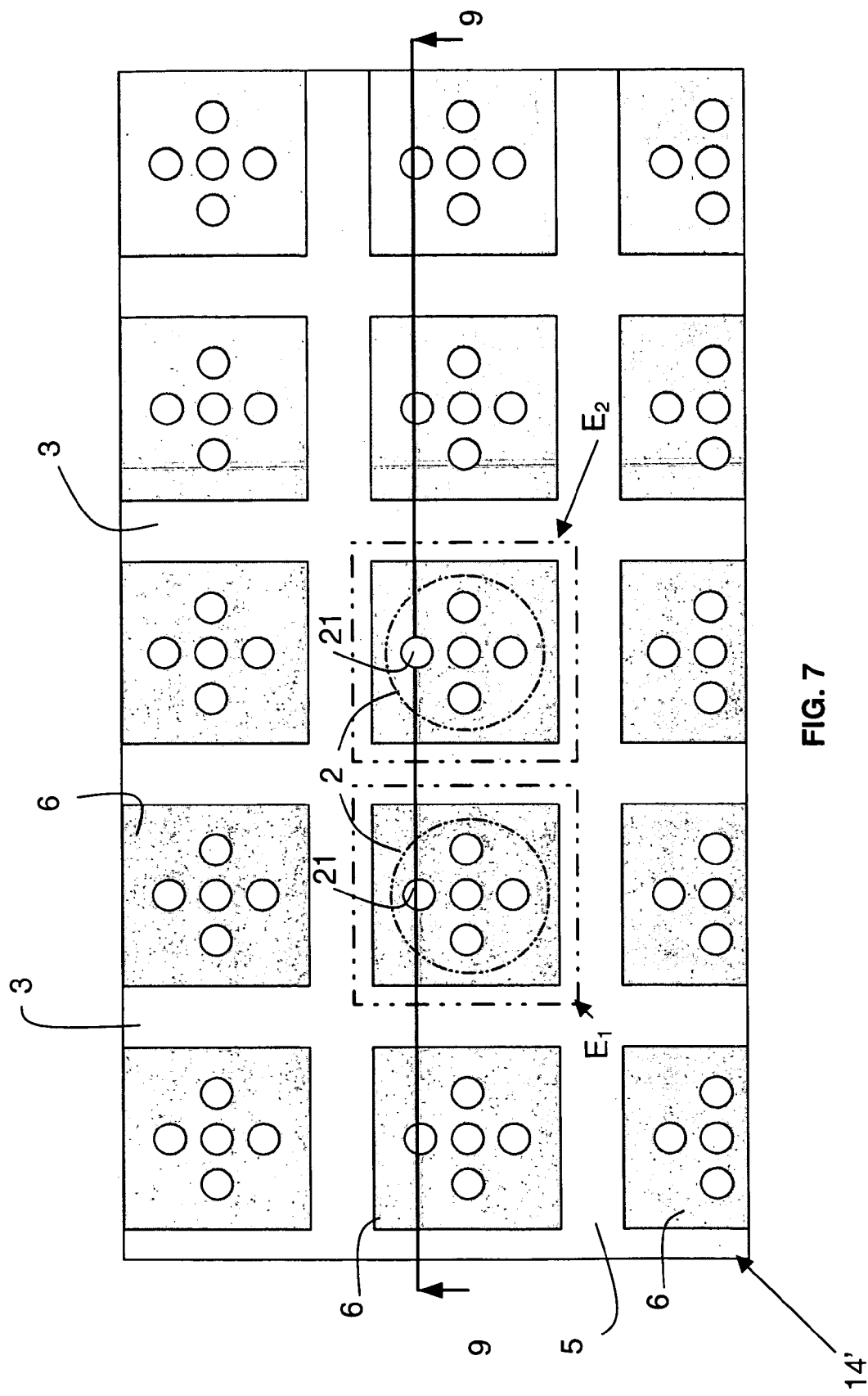
Figure 8:
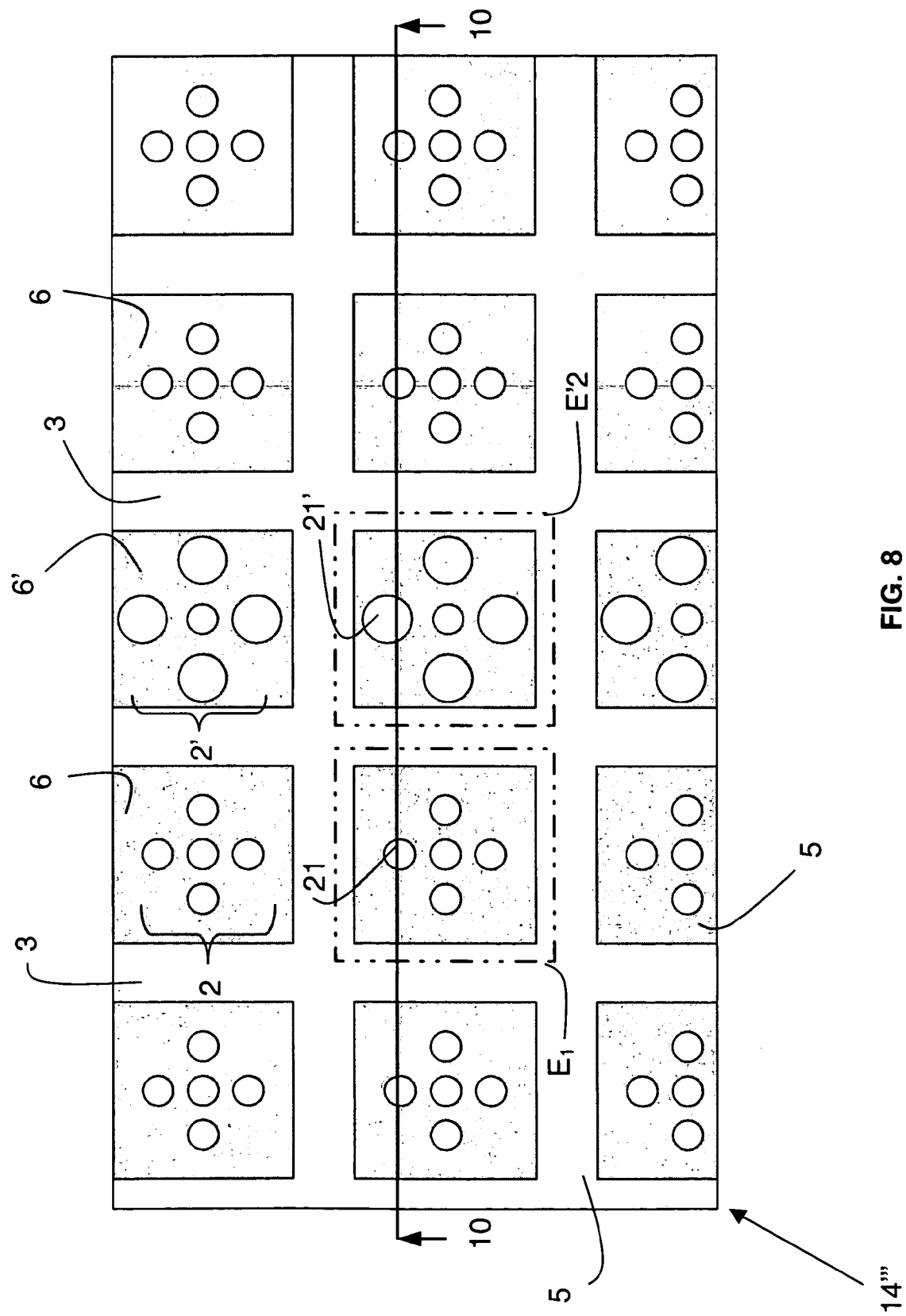
Figure 11:
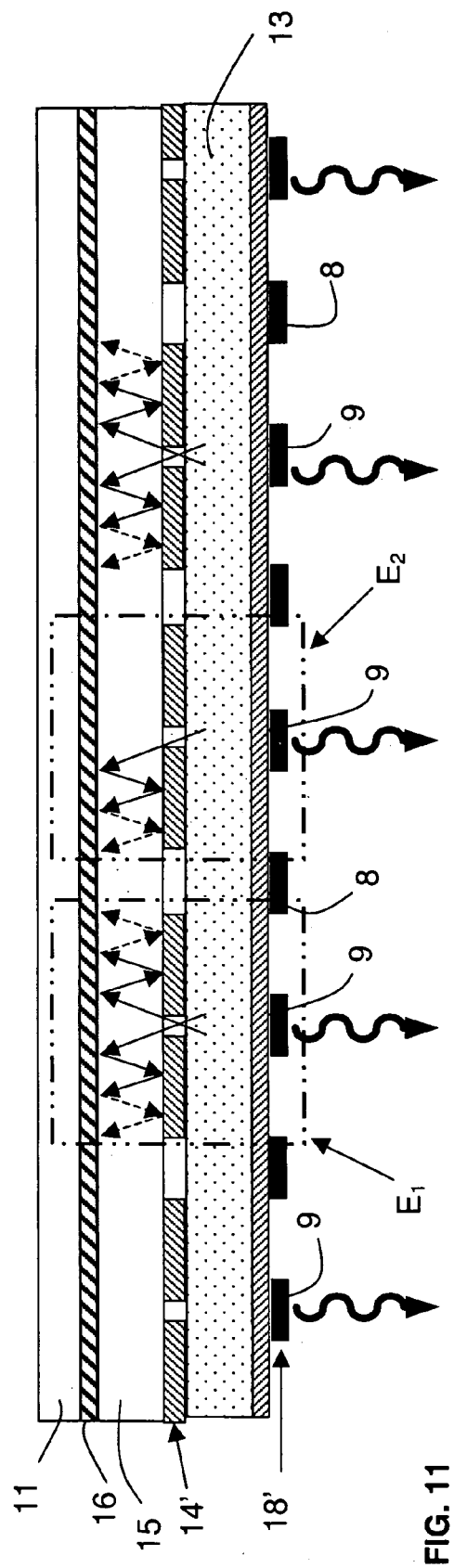
Figure 12:
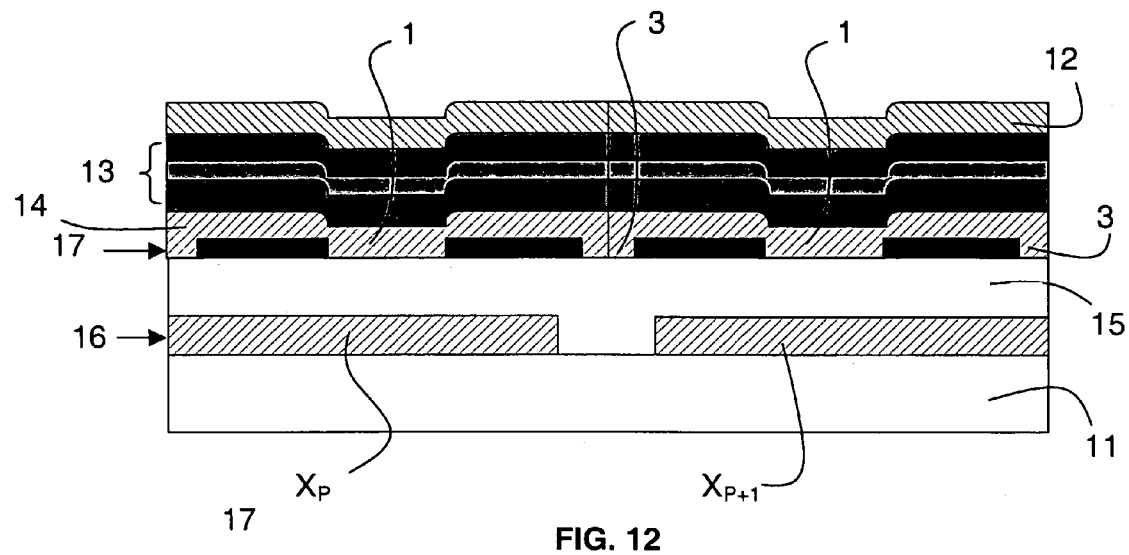
Figure 13:
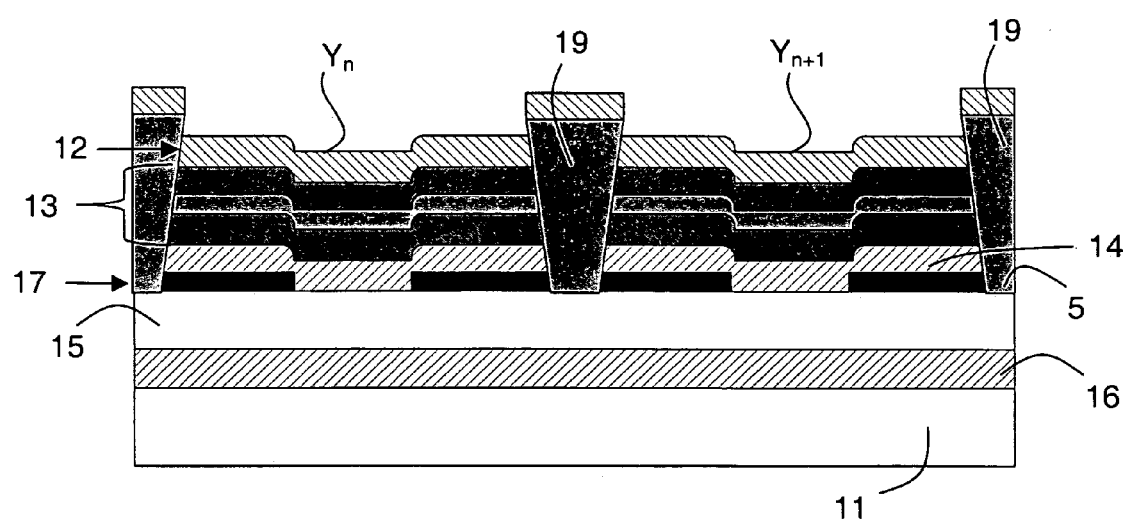
Figure 14:
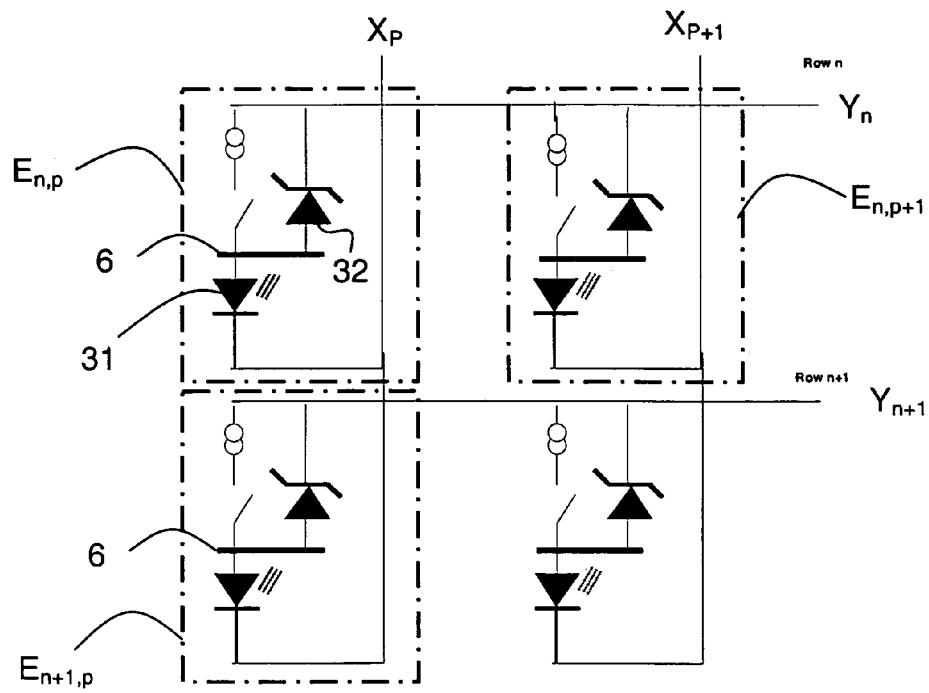
Figure 15:
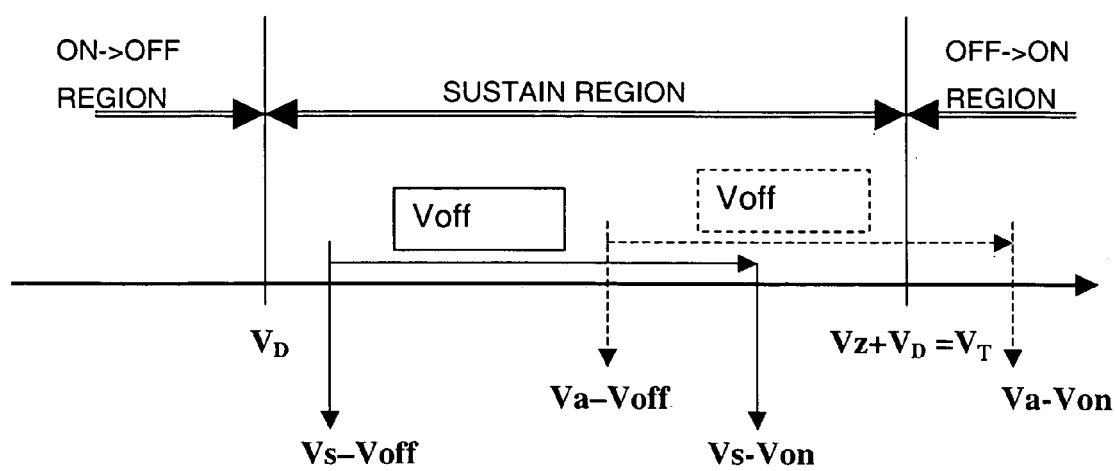
Figure 16:
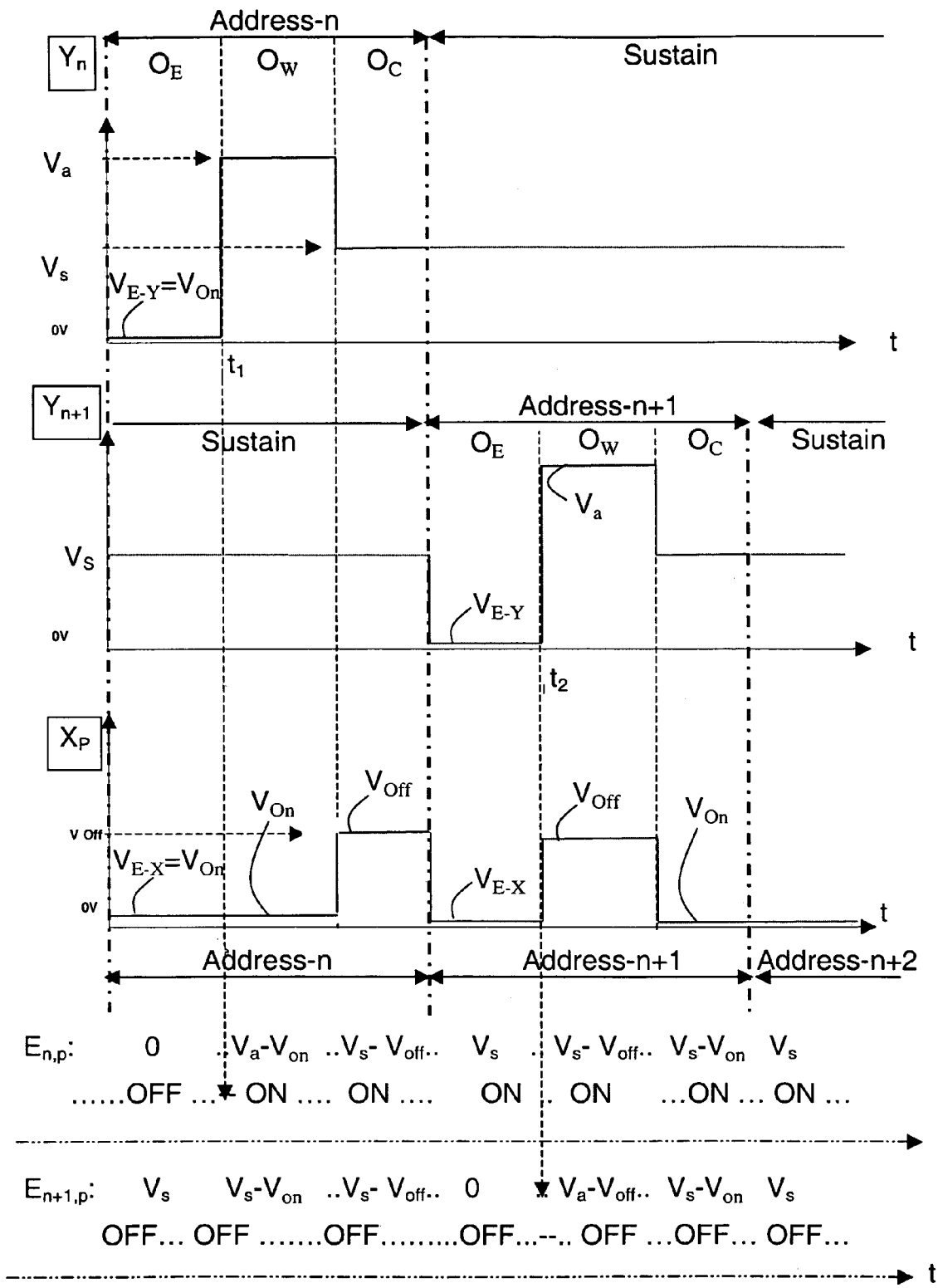

FIG. 7 shows, in a third embodiment of the invention, a top view of an intermediate layer formed in this case from opaque electrodes pierced with holes for the passage of the light within each cell FIG. 8 shows, in a fourth embodiment of the invention, a top view of an intermediate layer identical to that of FIG. 7 except that the aperture of the holes of each cell depends on the colour emitted by the cell;

FIG. 9 is a schematic sectional view along the axis 9-9 of a portion of a panel provided with the intermediate layer of FIG. 7 in the third embodiment;

FIG. 10 is a schematic sectional view along the axis 10-10 of a portion of panel provided with the intermediate layer of FIG. 8 in the fourth embodiment;

FIG. 11 is a schematic view identical to that of FIG. 9 except that, in a fifth embodiment, the panel is here provided on the front face with opaque masking elements arranged facing each aperture hole of the intermediate layer;

FIGS. 12 and 13 are cross sections of the panel but along the direction of the row electrodes and along the direction of the column electrodes, respectively, these being intended to illustrate one process for manufacturing the panel according to the invention;

FIG. 14 shows the equivalent circuit of a group of cells of the panel according to the invention;

FIG. 15 shows the potential differences applied to the electrodes, according to the method of operation in FIG. 16; and FIG. 16 shows voltage timing diagrams applied to electrodes of the panel according to the invention, for operating this panel.

The figures showing timing diagrams do not take into account the scale of values so that certain details are more clearly revealed, details which would not be clearly revealed if the proportions had been respected.

To simplify the description and demonstrate the differences and advantages that the invention has over the prior art, identical references will be used for the elements which provide the same functions.

Various embodiments of the panel according to the invention will be described below: one point common to all the panels according to the invention is that each cell is provided with an intermediate electrode and that the intermediate electrodes of the various cells are electrically isolated from one another; each cell therefore comprises, between a terminal connected to an electrode of the front layer and another terminal connected to an electrode of the rear layer, a region of the electroluminescent organic layer, an intermediate electrode and a region of the photoconducting layer; thus, all the intermediate electrodes are floating.

The memory effect that it is desired to obtain in each cell of this panel is intended to be able to use a method in which, for each row of cells of the panel in succession, the cell passes via an address phase intended to ignite the cells to be ignited in this row and then via a sustain phase intended to maintain the cells of this row in the state in which the preceding address phase has put or left them; while the cells of a row are in the address phase, all the cells of the other rows of the panel are in the sustain phase.

According to a conventional way of driving matrix panels, the duration of the sustain phases makes it possible to modulate the luminance of the cells of the panel and especially to generate the grey levels needed for displaying an image.

The implementation of a driving method using the memory effect of the cells of the panel then passes via:
  during the address phases, the application of an ignition voltage $V_a$ only to the terminals of the cells to be ignited;
  during the sustain phases, the application of a sustain voltage to all the cell terminals, which voltage may fluctuate but which must remain high enough for the previously ignited cells to remain ignited, and low enough not to risk igniting the cells not previously ignited.

The address phase is therefore a selective phase; in contrast, the sustain phase is not selective, thereby allowing the same voltage to be applied to all the cells and considerably simplifying the operation of the panel.

FIG. 14 shows the equivalent circuit of a number of cells $E_{n,p}$, $E_{n+1,p}$, $E_{n,p+1}$ ... of the panel according to the invention, which are supplied via rows of electrodes $Y_n$, $Y_{n+1}$ of the front layer 12 and columns of electrodes $X_p$, $X_{p+1}$ of the rear layer 16.

Each cell of the panel may be electrically represented as a light-emitting diode 31 in series with a Zener diode 32 having an intermediate electrode 6 as common point:
  the region of the electroluminescent layer 13 corresponding to this cell operates as a light-emitting diode;
  the corresponding region of the photoconducting layer 15 operates as a Zener diode because it is optically coupled with the region of electroluminescent layer; the Zener effect shown is obtained by combining the light emission threshold of the light-emitting diode with the photoelectric characteristic of the photoconducting material;
  the corresponding region of the intermediate layer 14 corresponds to the floating electrode 6.

We will now describe more specifically the memory effect that it is desired to obtain when a method of operation of the aforementioned type is applied to an electroluminescent panel in which, according to the invention, the intermediate electrodes of the various cells are electrically isolated from one another and are floating.

FIG. 16 illustrates, according to this conventional method of operation:
  for a cell $E_{n,p}$, a complete "address-n" phase, with ignition of this cell which remains on for $t > t_1$;
  for a cell $E_{n+1,p}$ of the next row "address-n+1", a complete address phase, without ignition of this cell which remains off for $t > t_2$.

The three timing diagrams $Y_n$, $Y_{n+1}$, $X_p$ indicate the voltages applied to the row electrodes $Y_n$, $Y_{n+1}$ and to the column electrode $X_p$ in order to obtain these sequences.

According to the invention and with reference to FIG. 16, each address phase comprises an erase operation $O_E$, a write operation $O_W$, and a so-called compensation operation $O_C$.

The bottom of FIG. 16 indicates the values of potentials at the terminals of the cells $E_{n,p}$, $E_{n+1,p}$ and the state, ON or OFF, of these cells.

The panel according to the invention is provided with supply and drive means suitable for being able to deliver the following signals to the electrodes:
  in the case of the row electrodes, either a voltage $V_{on}$, generally zero or close to zero, or a voltage referred to as the write initiation voltage $V_a$, or a sustain voltage $V_s$;
  in the case of the column electrodes, either the voltage $V_{on}$ referred to as the activation data voltage, or the voltage $V_{off}$ referred to as the non-activation data voltage.

The production of such supply means is within the competence of a person skilled in the art and will not be described here in detail.

To obtain the ON or OFF states indicated at the bottom of FIG. 16, it is therefore necessary that, by applying to the terminals of a cell as shown in FIG. 14:
  a potential difference $(V_a - V_{on})$ to a cell in the OFF state, this cell switches to the ON state;
  a potential difference $(V_s - V_{on})$ or $(V_s - V_{off})$ to a cell in the ON state, this cell remains in the ON state; and
  a potential difference $(V_a - V_{off})$ or $(V_s - V_{on})$ to a cell in the OFF state, this cell remains in the OFF state.

Denoting by $V_D$ the voltage to initiate emission from the light-emitting diode 31 and $V_z$ the critical voltage of the Zener diode 32, FIG. 15 repeats these various values of the potential by locating them with respect:
  to the threshold voltage $V_D$ at the terminals of the light-emitting diode 31 of the cell (FIG. 14), below which this diode is off and above which it is on;
  to the threshold voltage $V_D + V_Z$ at the terminals of a cell, above which a cell in the OFF state is ignited and switches to the ON state.

To obtain the desired memory effect by means of the panel according to the invention, the value of the voltage $V_{off}$ that can be applied to the column electrodes such as $X_p$ must be chosen such that the voltage $V_a - V_{off}$ applied to the terminals of a cell is insufficient to ignite it, and therefore that $V_a - V_{off} < V_D + V_Z$ and that the voltage $V_s - V_{off}$ does not affect the on or off state of the cell, therefore that the $V_D < V_s - V_{off}$.

The voltage $V_D + V_Z$ corresponds to a voltage $V_T$ at the terminals of a cell of the panel, above which a cell in the OFF state is ignited and switches to the ON state.

During each write operation $O_W$ of a row $Y_n$ of the panel, the average of the signals sent to the various columns $X_1, \ldots, X_p, \ldots$ depends on the number of cells to be activated or not to be activated in this row $Y_n$; during this write operation, all the other rows of the panel are in the sustain phase and the activated cells of these rows are supplied via the potential difference between the potential $V_s$ applied to these rows and the potential $V_{on}$ or $V_{off}$ applied to the column electrodes $X_p$; it may therefore be seen that the potential difference at the terminals of the cells in the sustain phase varies according to the columns to which they belong: $V_s-V_{on}$, or $V_s-V_{off}$; consequently, the light power emitted by the cells of the other rows will vary depending on whether, in the column to which they belong, the cell of the row $Y_n$ is to be activated or not.

The compensation operation $O_c$ which follows each write operation makes it possible to avoid this drawback: as illustrated in FIG. 16, this operation consists in applying a signal $V_{off}$ to the columns X receiving a data signal $V_{on}$ during the prior read operation $O_W$, or a signal $V_{on}$ to the columns X receiving a data signal $V_{off}$ during the prior write operation $O_W$; if, furthermore, the duration of application of this compensation signal is approximately equal to the duration of application of the prior data signal $V_{on}$ or $V_{off}$, it may be stated that, by integrating the duration of a write operation with that of a compensation operation, all the columns receive on average the same potential whatever the row addressed and whatever the number of cells to be activated or not activated in these rows, thereby making it possible to avoid the aforementioned drawback; these compensation operations which are integrated according to the invention with the address phases make it possible to ensure uniformity of emission of the non-addressed pixels of the panel.

Before each write operation $O_W$ for a row $Y_n$ of the panel, an erase operation $O_E$ is generally carried out, which consists in applying erase signals $V_{E-Y}$ and $V_{E-X}$ to the address and sustain electrode and to the data electrodes respectively; it is necessary to choose the condition $V_{E-Y}-V_{E-X}<V_D$ so as to turn off all the cells which are supplied via the said address and sustain electrode; in general, as illustrated in FIG. 16, to simplify the supply and drive means, the condition $V_{E-Y}=V_{E-X}=V_{on}$ is chosen.

We have therefore just seen how the electroluminescent panel according to the invention may be advantageously driven, in a very simple manner, by virtue of the memory effect and preferably by adding a compensation operation during the address phase.

Various embodiments of the panel according to the invention based on different modes of optical coupling between the electroluminescent layer and the photoluminescent layer will now be described.

Figure 3:
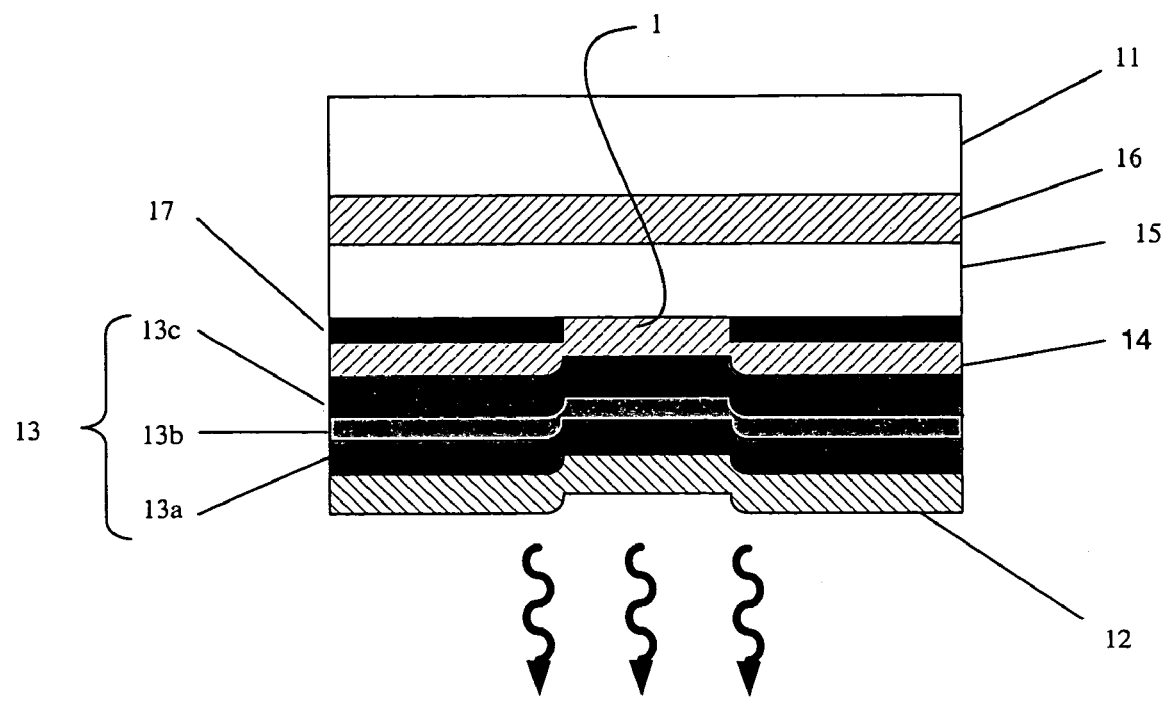
FIGS. 3 and 4 are schematic sectional views of a cell of a display panel according to the invention, in a first embodiment in which the electrodes of the intermediate layer are transparent and partly masked by an opaque layer pierced with holes.

Referring to FIG. 3, which relates to a first embodiment, the electrodes of the intermediate conducting layer 14 are transparent and in this case partly masked by an intermediate opaque layer 17 provided with apertures for passage of the light, in this case a hole 1; this intermediate opaque layer 17 lies between the intermediate conducting layer 14 and the photoconducting layer 15; each hole 1 for passage of the light is positioned approximately at the centre of the emitting surface of a cell; these holes are intended for optical coupling between the electroluminescent layer 13 and the photoconducting layer 15; in the embodiment shown here, the substrate 11 is at the back of the panel.

Figure 4:
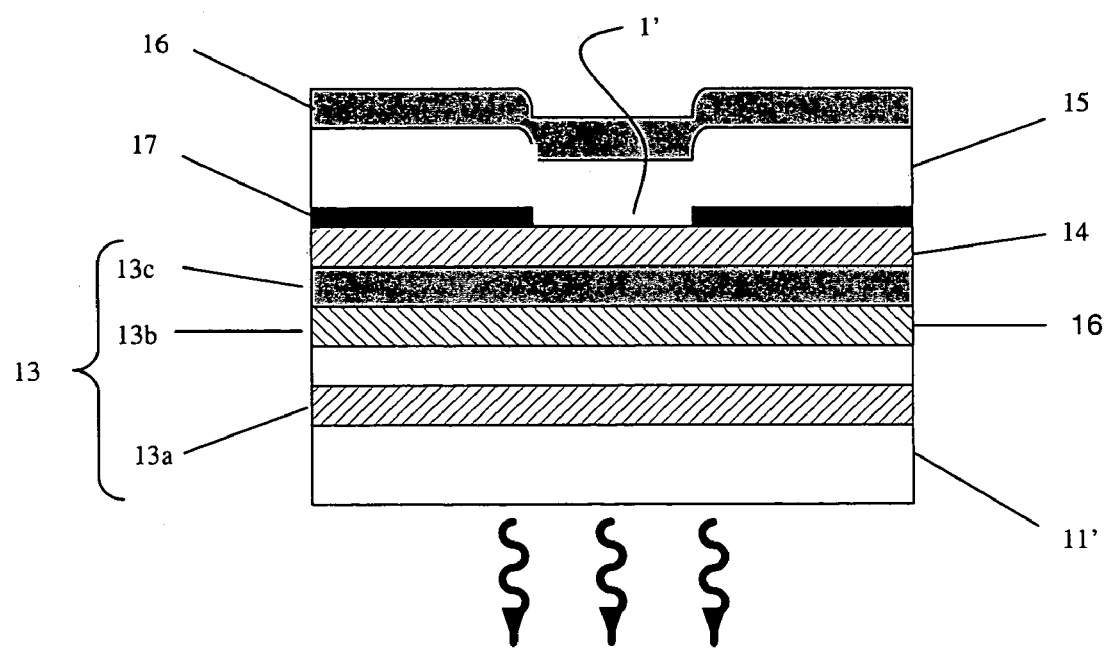

FIG. 4 shows an embodiment identical to that in FIG. 3, except that the substrate 11' is on the front face of the panel; this panel therefore emits the images through the substrate.

In general, by varying the number of holes per cell and the size of these holes or apertures made in the opaque intermediate layer 17, the excitation of the photoconducting layer 15 within each cell of the panel, may be very easily adapted locally, in order to obtain the desired memory effect; each group of apertures specific to a cell provides the optical coupling between the region of the electroluminescent layer and the region of the photoconducting layer which are specific to this cell; the optical coupling generated by a group of apertures specific to a cell depends not only on the area of these apertures or on the sum of the areas of the apertures of a group, but also on the arrangement and the shape of these apertures; the apertures of each group may have any suitable shape, for example a circular, square, elliptical or rectangular shape, or even one in the form of an elongate slot.

Figure 6:
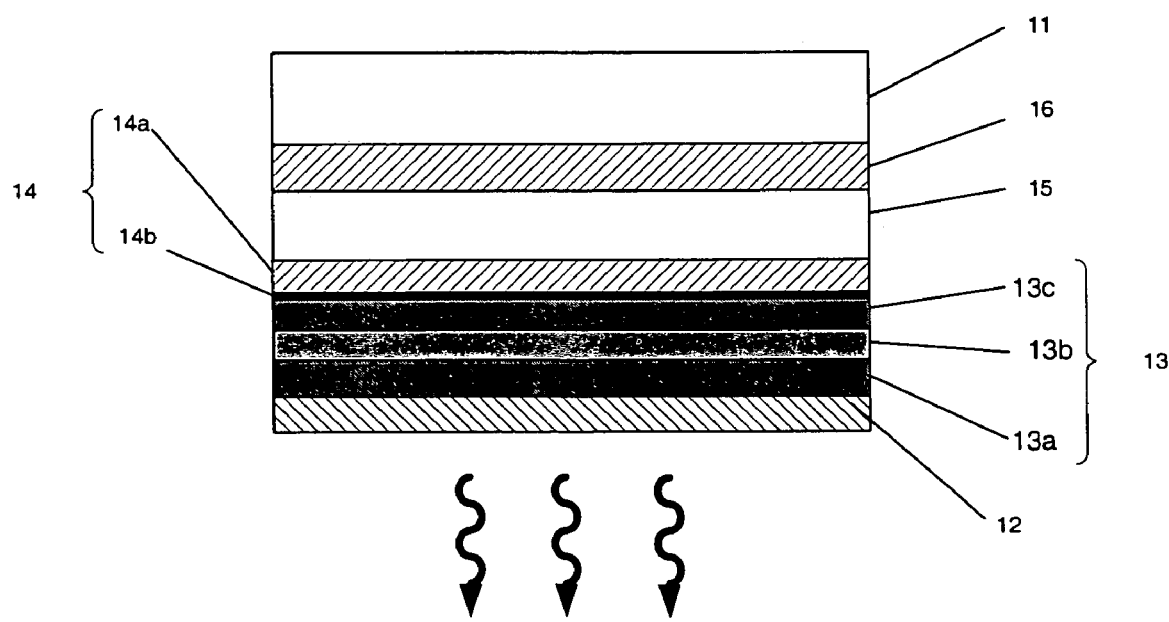

According to a second embodiment, shown in FIG. 6, the intermediate conducting layer 14 of electrodes is semi-transparent; it comprises a transparent conducting sublayer 14a of ITO (indium tin oxide) and a semi-transparent sublayer 14b based on aluminium with a thickness adapted to the desired optical density, generally between 10 and 100 nm; a film based on lithium fluoride with a mean thickness of the order of 1 nm is generally applied to the interface between this aluminium sublayer and the electron-injecting sublayer 13c.

Figure 5:
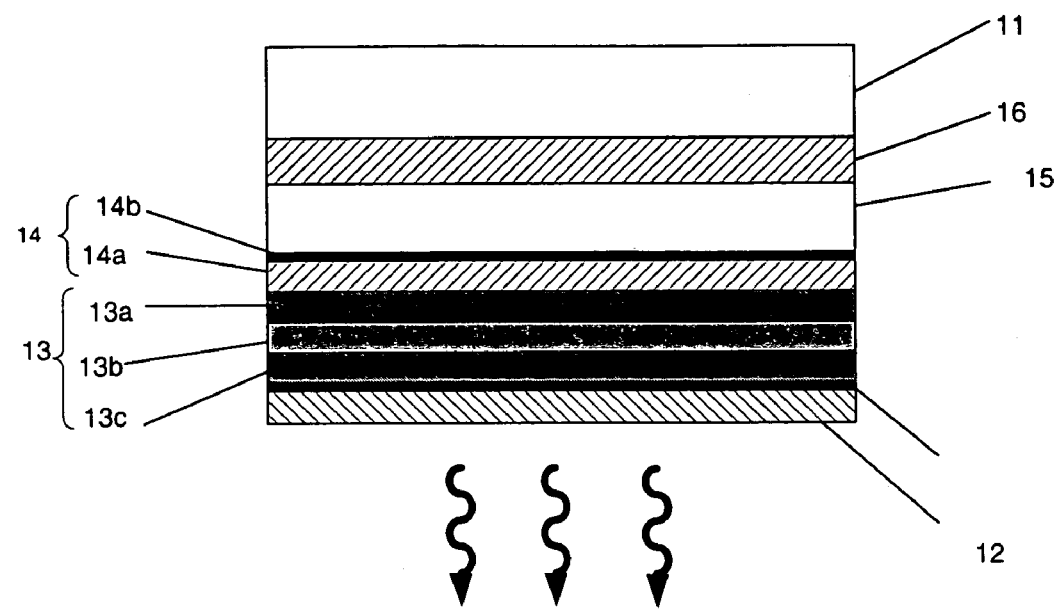
FIGS. 5 and 6 are schematic sectional views of a cell of a display panel according to the invention, in a second embodiment in which the electrodes of the intermediate layer are multilayer semi-transparent composites.

FIG. 5 shows an embodiment identical to that in FIG. 6, except that the structure of the electroluminescent layer is reversed; the electrodes of the front layer 12 are then cathodes and those of the intermediate layer 14 are anodes; for proper operation, the ITO sublayer 14a is then directly in contact with the hole-injecting sublayer 13a and the semi-transparent sublayer 14b is shifted to the interface with the photoconducting layer 15; no lithium fluoride film is then necessary.

In general, by varying the optical density of the semi-transparent intermediate conducting layer 14, in this case the thickness of the aluminium layer, the excitation of the photoconducting layer 15 within each cell of the panel may be very easily adapted locally, in order to obtain the desired memory effect.

According to a third embodiment, shown in FIGS. 7 and 9, the electrodes of the intermediate layer 14' are opaque and pierced with several apertures for passage of the light within each cell; as shown in FIG. 7 in a front view of the intermediate layer 14', this intermediate layer itself comprises, within each cell $E_1$, $E_2$ of the panel, a group 2 of five optical coupling apertures passing through this opaque layer, including for example the aperture 21 through which the plane of section 9-9 corresponding to FIG. 9 passes; as in the first embodiment, each group of apertures specific to a cell provides the optical coupling between the region of the electroluminescent layer and the region of the photoconducting layer which are specific to this cell.

As shown in FIG. 9, the panel here is furthermore provided in a conventional manner with a layer 18 for enhancing the contrast, this layer comprising opaque bands 8 positioned between the cells; these opaque bands 8 may be absorbent (black) or reflective.

When the opaque rear layer of electrodes is reflective, which is generally the case for enhancing the contrast, it is advantageous to use reflective bands for the contrast-enhancing layer 18 and to add, at the front face of the panel, a circular polarizer whose function will be to stop all internal reflections of ambient light.

As illustrated in FIG. 9, both interfaces of the photoconducting layer 15 are in this case reflective; these two interfaces correspond here to the surface of the rear layer 16 of electrodes and to the surface of the intermediate layer 14' of electrodes, both surfaces being in contact with the photoconducting layer 15.

As depicted by the arrows in FIG. 9, these reflective interfaces then act as a lightguide for the light arriving in the photoconducting layer 15 through the apertures 21 made in the layer 14' of intermediate electrodes; as this figure illustrates, this light may then propagate so as to illuminate and excite a large area of photoconducting layer, thereby advantageously reducing the electrical resistance of this layer in the excited state and limiting the electrical losses.

As each cell $E_1$, $E_2$ has its intermediate electrode 6, since the various intermediate electrodes 6 are electrically isolated from one another, the intermediate layer 14 presents discontinuities which form horizontal 3 and vertical 5 parallel bands of gaps in the layer 14 of intermediate electrodes in "inter-cell" regions.

This thus results in a panel whose adjacent cells $E_1$, $E_2$ are optically isolated from one another so that, within the lightguide formed by the photoconducting layer 15 and as the absence of light reflection arrows in the dotted region D of FIG. 9 illustrates, the light coming from a cell $E_1$ no longer reaches the neighbouring cell $E_2$; any risk of optical coupling between adjacent cells of the panel is thus very simply and economically limited.

In a fourth embodiment shown in FIGS. 8 and 10, which relates to polychromatic display panels, the area of the optical coupling apertures 21, 21' is different in the case of electroluminescent cells $E_1$, $E_2'$ which emit different colours; this arrangement makes it possible to adapt the optical coupling specific to each cell to the emission colour of this cell; it is then easy to obtain the same conductivity in the excited state for all the regions of the photoconducting layer 15 with regard to all the cells of the panel, whatever their emission colour, and thus improve the operation of the panel.

In a fifth embodiment of the invention, with reference to FIG. 11, the contrast-enhancing black matrix layer 18 comprises, apart from the contrast-enhancing opaque bands 8, opaque masking elements 9 each placed opposite each of the apertures 21 of the groups of optical coupling apertures 2; these opaque masking elements 9 limit the risk of ambient light entering the photoconducting layer 15 and the risk of malfunction of the panel in ambient light which would result therefrom.

To manufacture the electroluminescent display panels according to the invention, layer deposition and etching methods which are conventional for a person skilled in the art of this type of panel are used; a process for manufacturing such a panel will now be described with reference to FIGS. 12 and 13 which are cross sections of the panel in the direction of the row electrodes and in the direction of the column electrodes, respectively.

A uniform aluminium layer is deposited on a substrate 11, for example formed by a glass plate, by sputtering or by vacuum evaporation (PVD) and then the layer obtained is etched so as to form an array of parallel electrodes or column electrodes $X_p$, $X_{p+1}$; the opaque rear layer 16 of electrodes is thus obtained.

Upon this layer 16 of electrodes is then deposited a uniform layer of photoconducting material 15, for example amorphous silicon by plasma-enhanced chemical vapour deposition (PECVD), or an organic photoconducting material, by chemical vapour deposition (CVD) or by spin coating.

To manufacture a panel according to the first embodiment described above, the intermediate opaque layer 17 is then applied, a uniform aluminium layer is deposited as previously, and then the following are etched:

optical coupling apertures 1 to be made in this layer, grouped by pixels, each group of apertures being centred on the emitting area of a pixel;

inter-cell regions 3, 5 for electrically isolating, according to the invention, the intermediate electrodes of the adjacent cells and to optically isolate the cells of the panel from one another.

A thin layer of mixed indium tin oxide (ITO) of uniform thickness is then applied by vacuum sputtering; the thickness and the deposition conditions are adapted in a manner known per se in order to obtain a layer which has a conductivity in the direction parallel to the planes of the interfaces between the layers which is much lower than in the transverse direction of the thickness; although the layer is of uniform thickness, it is thus possible to electrically isolate, according to the invention, the intermediate electrodes of the adjacent cells, thereby allowing the method of driving the panel described above to be used; the layer obtained corresponds to the intermediate layer 14 of electrodes.

Next, an array of barrier ribs 19 intended to divide the panel into rows of electroluminescent cells is formed: for this purpose, a uniform layer of organic barrier-rib resin is firstly deposited by spin coating and then this layer is etched so as to form the array of resin barrier ribs 19 perpendicular to the column electrodes; the thickness of this layer or the height of the barrier ribs is substantially greater than the thickness of the layers yet to be deposited, as shown in FIG. 13.

The organic layers intended to form rows of electroluminescent cells are then deposited between the barrier ribs 19: the electroluminescent organic layer 13 is thus obtained.

Next, the transparent conducting layer 12 is deposited, again between the barrier ribs, so as to form rows of electrodes $Y_n$, $Y_{n+1}$: this layer preferably includes the cathode and an ITO layer.

An image display panel according to the invention is thus obtained.

The invention claimed is:

1. Image display panel formed from a matrix of electroluminescent cells having a memory effect, which are capable of emitting light towards the front of the said panel, comprising:

an electroluminescent organic layer;

to the front of this layer, a transparent front layer of electrodes;

to the rear of this layer, a photoconducting layer for obtaining the said memory effect, the said photoconducting layer itself being inserted between an opaque rear layer of electrodes and an intermediate transparent or semitransparent layer of intermediate electrodes in contact with the electroluminescent layer, wherein each cell is provided with and intermediate electrode and in that the intermediate electrodes of the various cells are electrically isolated from one another; and an opaque layer lying between the said electroluminescent layer and the said photoconducting layer which itself includes, within each cell of the panel, a group of at least one optical coupling aperture passing through the said opaque layer, wherein said panel comprises at least two groups of electroluminescent cells $E_1$, $E_2'$ which are capable of emitting light of a different color and wherein the density of apertures and/or the sum of the areas of the apertures of a group of apertures differ/differs depending on the said groups of cells $E_1$, $E_2'$ of different color.

2. Panel according to claim 1, wherein, with each cell of the panel being supplied between an address and sustain electrode for the said front or rear layer and an electrode referred to as the data electrode for the other, rear or front, layer, it comprises supply and drive means suitable:

for applying, in succession to each address and sustain electrode, a signal referred to as the write initiation signal $V_a$ during an address phase and for applying, during the same time, a signal referred to as the sustain signal $V_s$, to the other address and sustain electrodes; and during application of a write signal $V_a$ to the said address and sustain electrode, for simultaneously applying to the data electrodes a data signal of value either $V_{off}$ or $V_{on}$ depending on whether it is desired not to activate or to activate, respectively, the cell located at the intersection of the data electrode in question with the said address and sustain electrode during the subsequent sustain phase of the cells supplied via the said address and sustain electrode.

3. Panel according to claim 2, wherein, if $V_T$ is the voltage at the terminals of a cell of the panel above which a cell in the non-activated state "OFF" switches to the activated state "ON", and if $V_D$ is the voltage for triggering the emission from that portion of the said electroluminescent layer which corresponds to a cell, the said supply and drive means are designed so that:

$$V_a - V_{on} \geq V_T \text{ and } V_a - V_{off} < V_T$$

$$V_s - V_{on} < V_T \text{ and } V_s - V_{off} > V_D.$$

4. Panel according to claim 2, wherein the said supply and drive means are suitable for simultaneously applying, during each phase of addressing and address and sustain electrode, a signal referred to as the compensation signal $V_C$ to the various data electrodes, where $V_C = V_{off}$ for the data electrodes receiving a data signal $V_{on}$ during the said address phase, where $V_c = V_{on}$ for the data electrodes receiving a data signal $V_{off}$ during the address phase, the duration of application of the said compensation signal $V_C$ being approximately equal to the duration of application of the data signal $V_{on}$ or $V_{off}$.

5. Panel according to claim 1, wherein each group of at least one aperture is positioned approximately at the center of a cell.

6. Panel according to claim 1, wherein the said opaque layer forms part of the said intermediate layer of electrodes.

7. Panel according to claim 1, wherein it comprises, facing each aperture of each group of optical coupling apertures, an opaque masking element positioned to the front of the said electroluminescent layer.

8. Panel according to claim 1, wherein the said intermediate layer of electrodes is semi-transparent and has an optical density adapted to the necessary optical coupling between the said electroluminescent layer and the said photoconducting layer in order to obtain the said memory effect.

9. Panel according to claim 1, wherein the two interfaces of the photoconducting layer are reflective.

* * * * *